United States Patent [19]
Kamon

[11] Patent Number: 5,248,574
[45] Date of Patent: Sep. 28, 1993

[54] PHOTOMASK

[75] Inventor: Kazuya Kamon, Hyogo, Japan

[73] Assignee: Mitsubishi Denki Kabushiki Kaisha, Tokyo, Japan

[21] Appl. No.: 669,250

[22] Filed: Mar. 14, 1991

[30] Foreign Application Priority Data

Sep. 11, 1990 [JP] Japan .................. 2-241752

[51] Int. Cl.⁵ ............................. G03F 9/00
[52] U.S. Cl. ............................. 430/5; 430/321
[58] Field of Search ..................... 430/5, 321

[56] References Cited

U.S. PATENT DOCUMENTS 4,876,164 10/1989 Watakabe et al. ............ 430/5
5,039,203 8/1991 Nishikawa ................... 430/5
5,045,417 9/1991 Okamoto ..................... 430/5

Primary Examiner—Marion E. McCamish
Assistant Examiner—Mark A. Chapman
Attorney, Agent, or Firm—Lowe, Price, LeBlanc & Becker

[57] ABSTRACT

Disclosed herein is a photomask including: a light-transmitting substrate; a light-shielding layer provided on the substrate; a substantially tetragonal aperture opened in the light-shielding layer; and shifter portions which transmit light and, at the same time, invert the phase of light, the shifter portions being provided along intermediate portions, but not in the vicinity of both end portions, of each edge of the substantially tetragonal aperture, in a predetermined width.

21 Claims, 12 Drawing Sheets

PHOTOMASK

BACKGROUND OF THE INVENTION

1. Field of the Invention

This invention relates to a photomask used in photolithography, and more particularly to an improvement in the photomask used in photolithography for production of LSI semiconductor device.

2. Description of the Prior Art

Referring to FIG. 7, there is shown, in plan view, an example of a conventional photomask. In the figure, a light-shielding layer 61 of chromium (Cr) is provided on a light-transmitting substrate 60 such as a glass plate. The light-shielding layer 61 is provided with an aperture 61a, which is substantially square. Light passing through the aperture 61a is projected onto a semiconductor wafer through a lens system.

When the photomask shown in FIG. 7 is exposed to incident light having a uniform intensity distribution with an initial intensity of "1", the transmitted light directly below the aperture 61a has an intensity of "1", whereas the transmitted light directly below the light-shielding layer 61 has an intensity of "0". That is to say, the transmitted light has a stepped form intensity distribution, with an intensity level of "1" or "0", in the vicinity of the aperture 61a. As the length of one side of the aperture 61a approaches the limit of resolution limit, however, the transmitted light projected onto the wafer through the lens system comes to have an intensity distribution represented by the concentric circular contour lines in FIG. 8A, because of diffraction caused by the small hole.

FIG. 8B shows the intensity distribution of light along line 8B—8B of FIG. 8A. It is seen that, in spite of the substantially square shape of the aperture 61a formed in the photomask shown in FIG. 7, the pattern of the light project on the wafer is substantially circular and, further, the intensity distribution of the projected light is not a stepped distribution but a Gaussian distribution.

Referring now to FIG. 9, there is illustrated the shape of a hole formed in a resist layer by use of the photomask of FIG. 7. The resist layer 91 is provided on a semiconductor wafer 90, and the hole 92 is formed in the resist layer 91 developed. In the perspective view in FIG. 9, the wafer 90 and the resist layer 91 are depicted as cut along a vertical plane passing through the center of the hole 92, in order to show the shape of the hole 92 more clearly. As is apparent from the figure, the hole 92 has the shape of a cylindrical well. That is, as the size of the hole to be formed in a resist layer becomes smaller, it becomes difficult to form a hole with a substantially tetragonal shape in horizontal section by use of a photomask according to the prior art.

As mentioned above, with the conventional photomasks it is difficult to focus a tetragonal optical pattern onto a wafer with good fidelity. In addition, the conventional photomasks have the problem of deterioration in the contrast of the optical pattern.

SUMMARY OF THE INVENTION

In consideration of the problems involved in the prior art as mentioned above, it is an object of this invention to provide a photomask by which a fine tetragonal optical pattern can be formed on a semiconductor wafer with high contrast.

According to this invention, there is provided a photomask comprising: a light-transmitting substrate; a light-shielding layer provided on the substrate; a substantially tetragonal aperture opened in the light-shielding layer; and shifter portions which transmit light and, at the same time, invert the phase of light, the shifter portions being provided along intermediate portions, but not in the vicinity of both end portions, of each side of the substantially tetragonal aperture, in a predetermined width.

In the photomask according to this invention, the intensity of the light spreading orthogonally to each edge of the tetragonal aperture due to the diffraction associated with the small hole is reduced by interference with the light the phase of which has been inverted by passage through the shifter portion. On the other hand, the light passed through each corner portion of the tetragonal aperture without being affected by the shifter portions contributes to the intensity of light at the corresponding corner portion of the optical pattern projected on the semiconductor wafer. Therefore, it is possible, by use of the photomask of this invention, to form a fine tetragonal optical pattern on a semiconductor wafer with high contrast.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
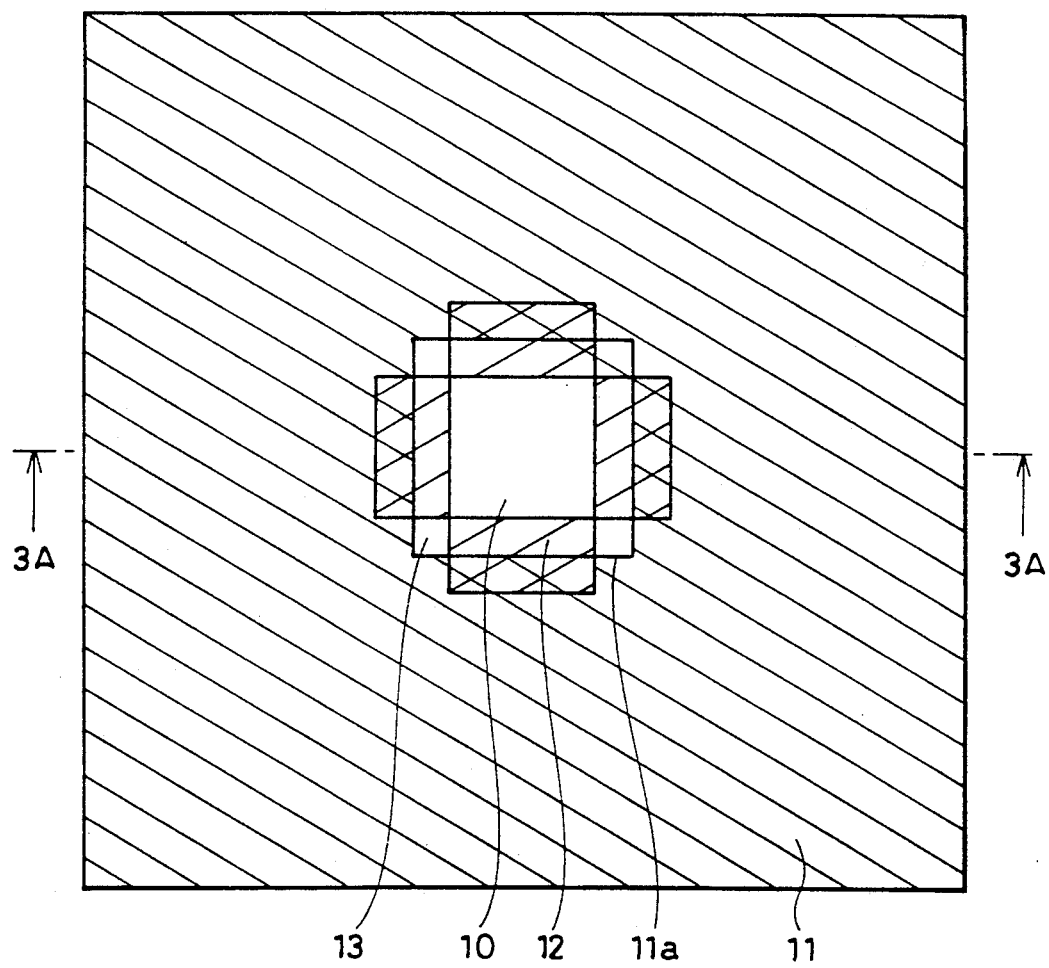
FIG. 1 is a plan view of a photomask according to one embodiment of this invention.

Referring first to FIG. 1, there is shown in plan view a photomask according to one embodiment of this invention. A light-shielding layer 11 of chromium (Cr) is formed on a light-transmitting substrate 10 such as a glass plate. A substantially square aperture 11a is opened in the light-shielding layer 11. Shifter portions 12 are provided along intermediate portions, but not in the vicinity of both end portions, of each side of the substantially square aperture 11a, in a predetermined width. That is, the shifter portion 12 is not provided at any of corner portions 13 of the aperture 11a. The shifter portions 12 transmit light therethrough and, at the same time, invert the phase of the light transmitted therethrough.

Figure 2A:
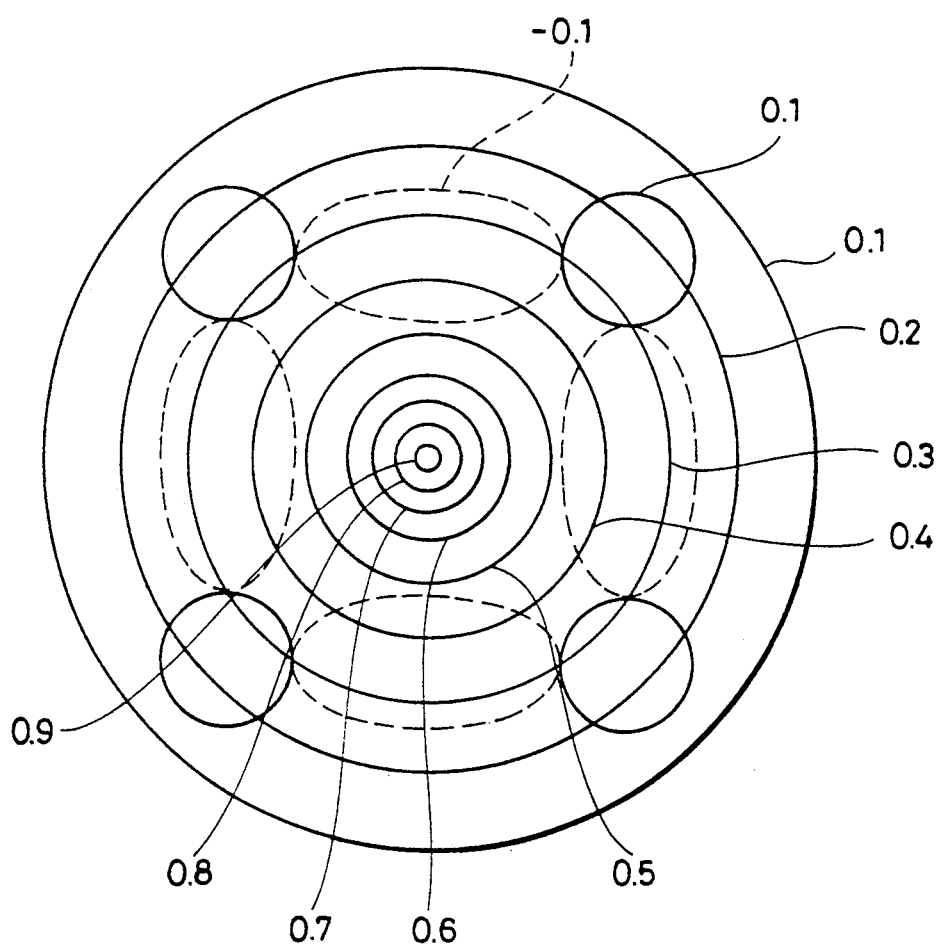
FIG. 2A is a diagram showing the intensity distribution of the light passed through different areas of the aperture in the photomask of FIG. 1.

Referring to FIG. 2A, the intensity on a semiconductor wafer of the light passed through different areas of the aperture 11a in the photomask of FIG. 1 is represented by contour lines. The contour lines extending along concentric circles and representing the intensity values of 0.1 to 0.9 show the intensity distribution on the semiconductor wafer of the light passed through the aperture 11a, on the assumption that the shifter portions 12 are not provided. The elongate elliptic contour lines, drawn in broken lines, represent the intensity distribution of the light passed through the shifter portions 12. Because the light transmitted through the shifter portion 12 has its phase inverted, the light is considered to have a negative amplitude. The circular contour lines shown in proximity to both end portions of the elongate elliptic contour lines represent the intensity distribution of the light passed through the corner portions 13 of the aperture 11a. Because no shifter portion 12 is provided at the corner portion 13, the light passed through the corner portion 13 has a positive intensity.

Figure 2B:
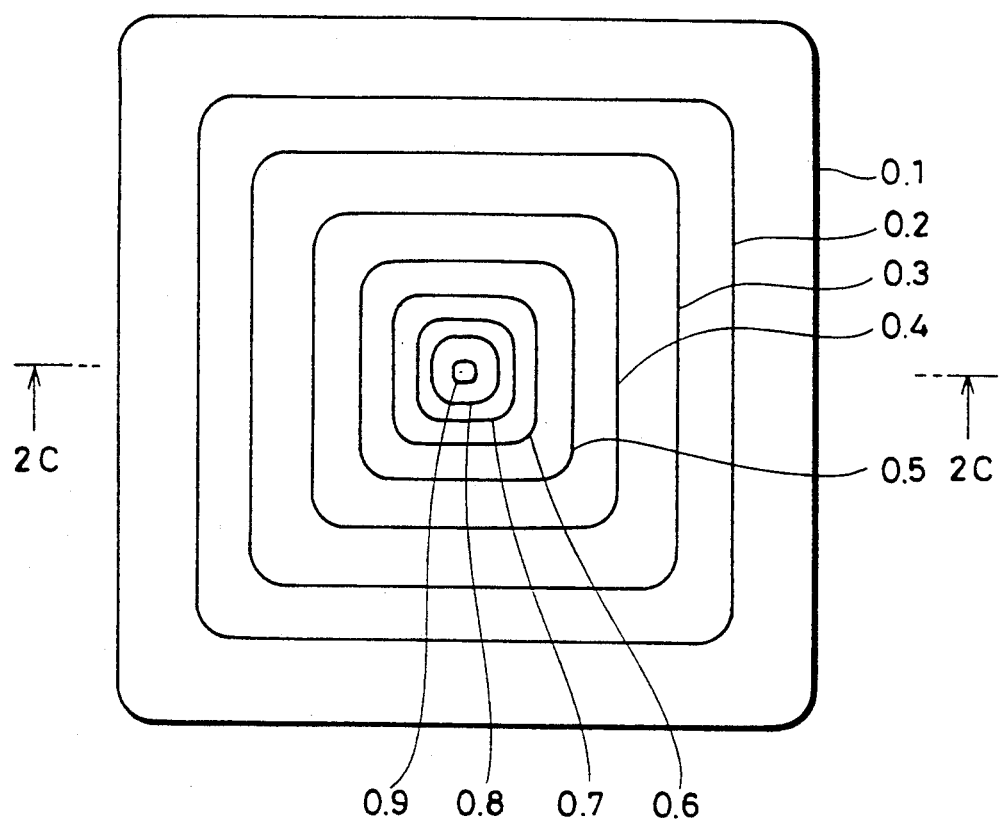
FIG. 2B is a diagram showing the intensity distribution of an optical pattern formed on a semiconductor wafer by the aperture in the photomask of FIG. 1.

FIG. 2B shows the result of combining the different kinds of contour lines in FIG. 2A. That is, the contour lines in FIG. 2B represent the intensity distribution of an optical pattern formed on the semiconductor wafer by the light passed through the photomask of FIG. 1. As is seen from FIG. 2B, the photomask of FIG. 1 ensures that a substantially square optical pattern corresponding to the square aperture 11a can be formed on the semiconductor wafer.

Figure 2C:
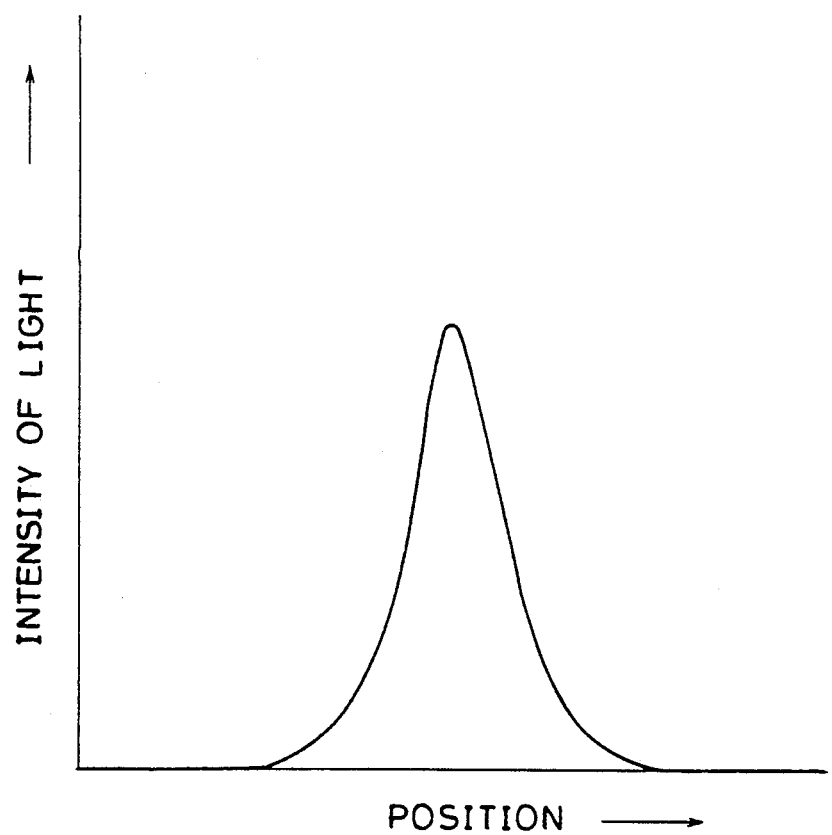
FIG. 2C is a diagram showing the intensity distribution of light along line 2C—2C of FIG. 2B.
Figure 8A:
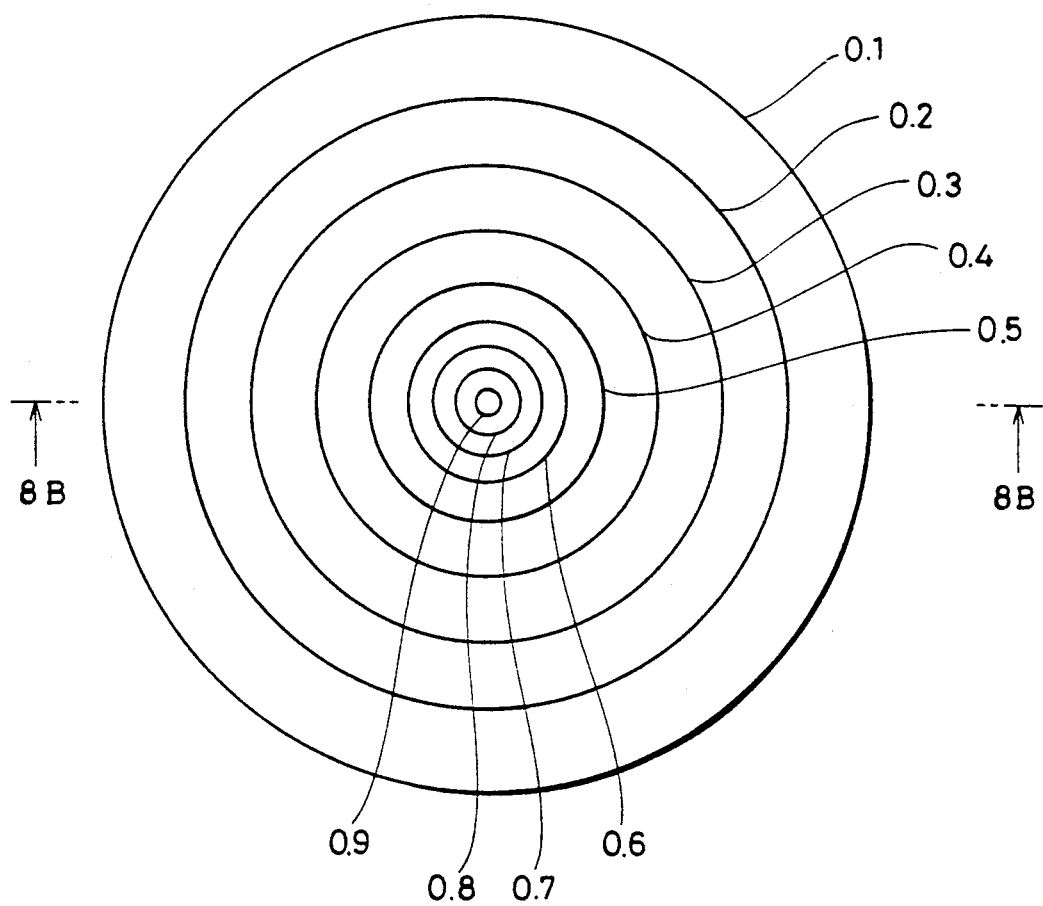
FIG. 8A is a diagram showing the intensity distribution of an optical pattern formed on a semiconductor wafer by the photomask shown in FIG. 7.
Figure 8B:
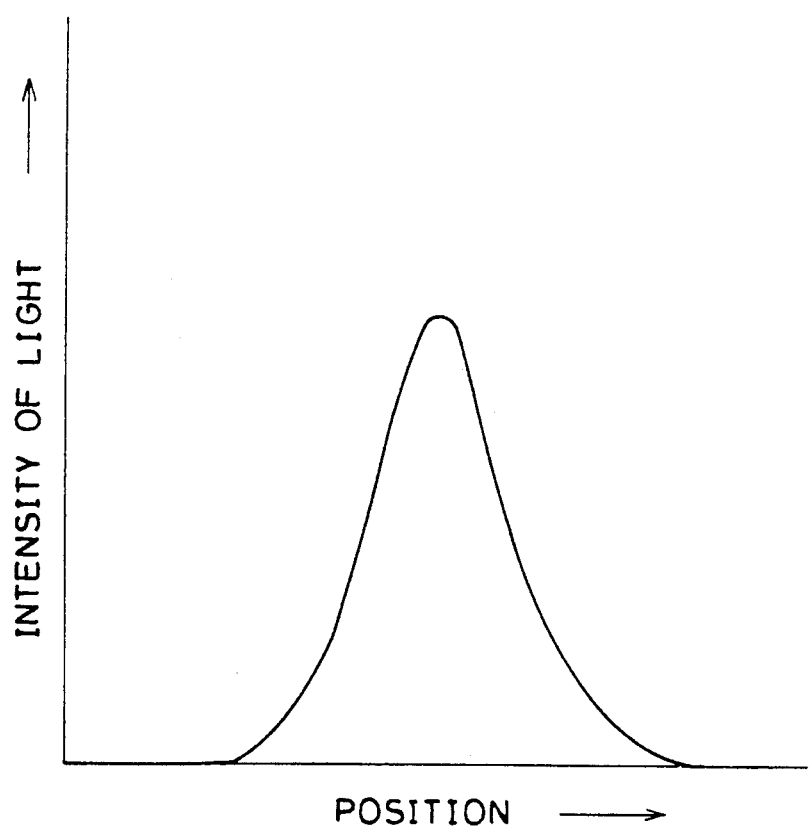
FIG. 8B is a diagram showing the intensity distribution of light along line 8B—8B of FIG. 8A.
Figure 9:
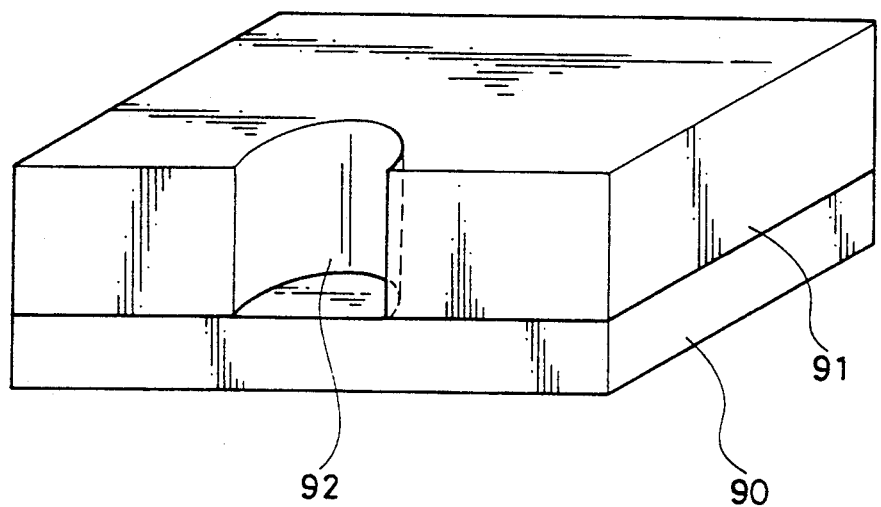
FIG. 9 is a perspective view showing the shape of a hole formed in a resist layer by use of the photomask of FIG. 7.

FIG. 2C shows the intensity distribution of light along line 2C—2C of FIG. 2B. The intensity distribution shown in FIG. 2C has a narrower half-width than that in FIG. 8B, thereby indicating an improvement in the contrast of the optical pattern.

FIGS. 3A to 3E illustrate the diffraction and interference phenomena accompanying the propagation of the light passed through the aperture 11a of the photomask shown in FIG. 1.

Figure 3A:
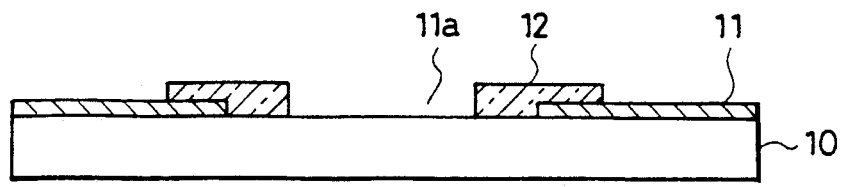
FIGS. 3A to 3E illustrate the diffraction and interference of the light passed through the aperture in the photomask of FIG. 1.

Referring first to FIG. 3A, there is shown a section of the photomask along line 3A—3A of FIG. 1. In this figure, light having a uniform amplitude of "1" is projected from above.

Figure 3B:
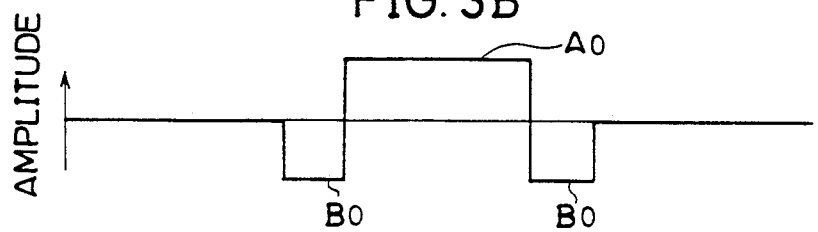

Next, referring to FIG. 3B, the light $A_0$ passed through a major portion of the aperture 11a has a uniform amplitude of "1", directly below the photomask. On the other hand, the light $B_0$ transmitted through the shifter portion 12 has its phase inverted and, accordingly, is considered to have a negative uniform amplitude of "$-1$".

Figure 3C:
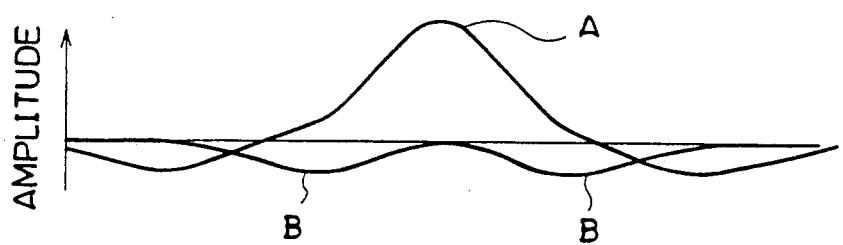

As shown in FIG. 3C, the diffraction associated with the small hole causes the amplitude distribution to spread as the light travels. Curve A represents the spreading of the light $A_0$ passed through the major portion of the aperture 11a, whereas curve B shows the spreading of the light $B_0$ transmitted through the shifter portion 12.

Figure 3D:
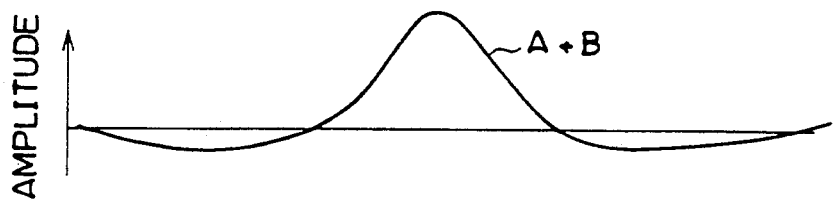

Referring now to FIG. 3D, curve A+B represents the result of superposition of the amplitude of curve A with the amplitude of curve B by interference.

Figure 3E:
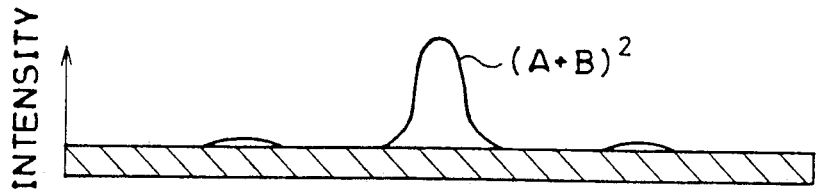

Referring to FIG. 3E, curve $(A+B)^2$ represents the intensity distribution of light which has an amplitude distribution of curve A+B.

Thus, the light passed through the shifter portions 12 acts to cancel, by interference, those portions of the light passed through the major areas of the square aperture which are spreading orthogonally to each side of the square. On the other hand, the light passed through each of the corner portions 13 of the aperture 11a, where the shifter portion 12 is not provided, acts to enhance the light intensity at the corresponding corner portion of the optical pattern formed on the semiconductor wafer.

Figure 4:
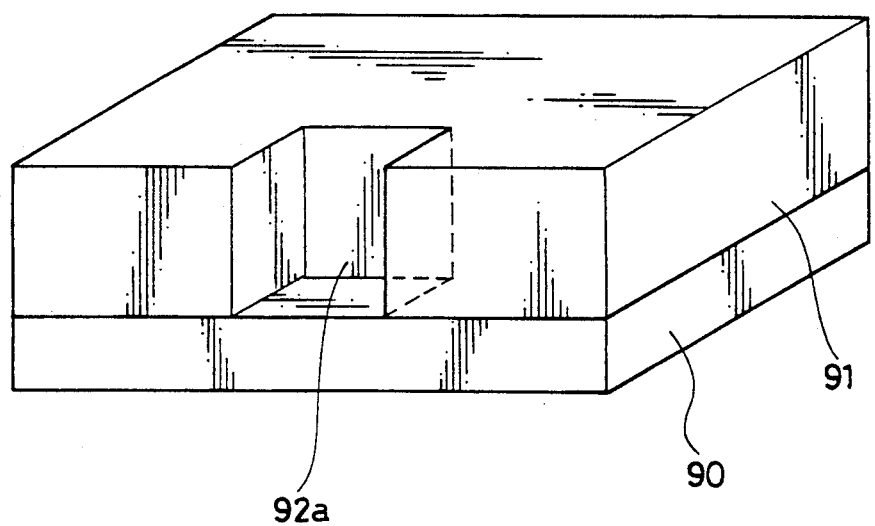
FIG. 4 is a perspective view showing the shape of a hole formed in a resist layer by use of the photomask of FIG. 1.

FIG. 4 illustrates the shape of a hole formed in the resist layer by use of the photomask of FIG. 1. The resist layer 91 is provided on a semiconductor wafer 90, and the hole 92a is formed in the developed resist layer 9. In the perspective view in FIG. 4, the wafer 90 and the resist layer 91 are depicted as cut along a vertical plane passing through the hole 92a, for showing the shape of the hole 92a more clearly. As is apparent from the figure, the horizontal section of the hole 92a is substantially tetragonal, that is, the hole 92a has a horizontal section of high fidelity to the pattern of the tetragonal aperture 11a of the photomask.

Figure 5A:
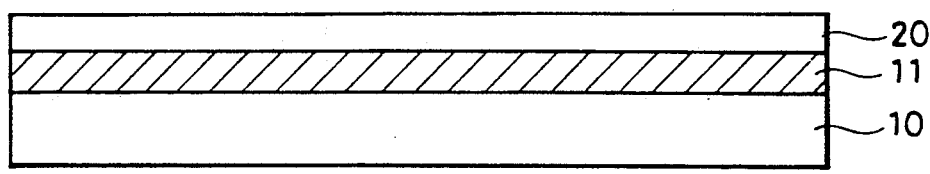
FIG. 5A to 5E are sectional views illustrating a manufacturing process of a photomask according to this invention.
Figure 5B:
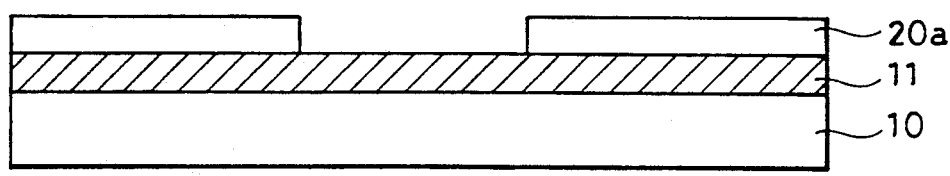
Figure 5C:
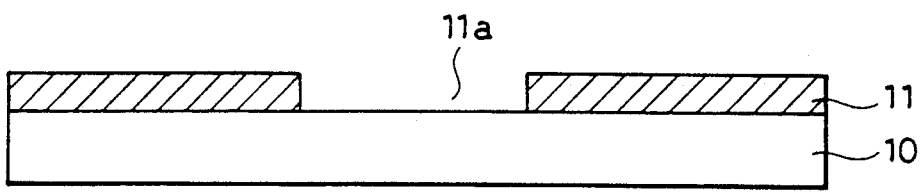
Figure 5D:
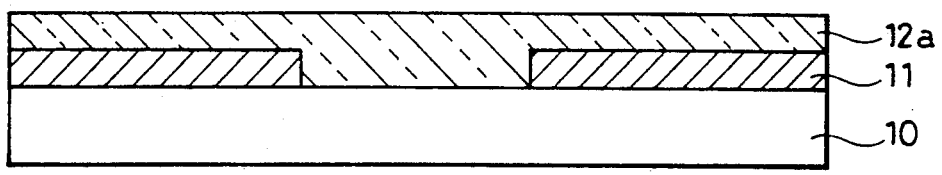
Figure 5E:
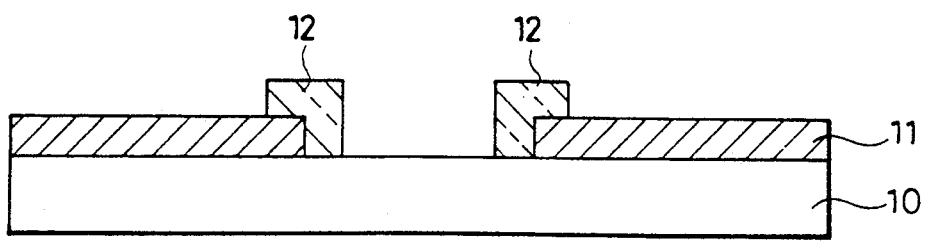

FIGS. 5A and 5E are sectional views illustrating a process for manufacturing the photomask of FIG. 1.

Referring to FIG. 5A, a Cr layer 11 and a resist layer 20 are sequentially provided on a light-transmitting substrate 10 such as a glass plate or a quartz plate. The resist layer 20 can be formed by applying ODUR 1000 (a polymethyl methacrylate (PPMA), produced by Tokyo Ohka Kogyo Co., Ltd.) in a thickness of about 1 to 2 μm.

Referring to FIG. 5B, the resist layer 20 is exposed to electron beams at an energy density of about 150 mJ/cm$^2$, and then developed. As a result, a mask 20a composed of a patterned resist layer is formed.

Referring to FIG. 5C, the Cr layer 11 is subjected to anisotropic etching by use of the mask 20 of the resist layer to form an aperture 11a, and the mask 20a is removed.

Referring to FIG. 5D, the aperture 11a and the Cr layer 11 are covered by a resist layer 12a of, for example, polymethyl methacrylate (PMMA). The resist layer 12a is exposed to electron beams and then developed, whereby shifter portions 12 are formed. Consequently, the photomask shown in FIG. 1 is completed.

FIGS. 6A to 6D illustrate an example of application of the photomask of this invention to the manufacturing process of a stacked type memory cell in which field shield is employed for separation between circuit elements.

Figure 6A:
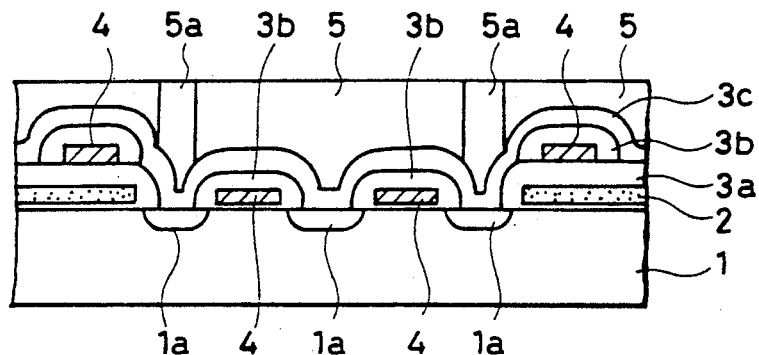
FIGS. 6A to 6D are sectional views for illustrating an example of applying the photomask of this invention to the production of a memory cell.

Referring to FIG. 6A, source/drain regions 1a are formed on one major surface of a semiconductor substrate 1. The field shield 2 is formed on the major surface, and is covered by a first insulator film 3a. On the substrate 1 are formed word lines 4, which are covered by a second insulator film 3b. The upper surfaces of the source/drain regions 1a, the first insulator film 3a and the second insulator film 3b are covered by a third insulator film 3c. A resist layer 5 is formed on the third insulator film 3c. The resist layer 5 is exposed through the photomask according to this invention, whereby holes 5a for anisotropic etching are formed. The holes 5a are tetragonal in horizontal section, similarly to the hole 92a shown in FIG. 4.

Figure 6B:
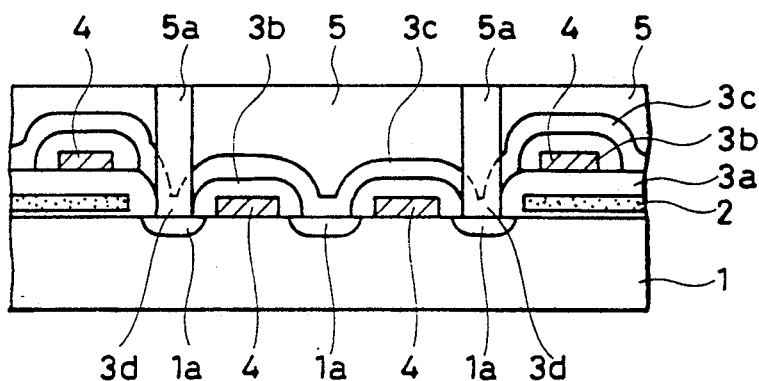

Referring to FIG. 6B, the third insulator film 3c is anisotropically etched through the holes 5a, whereby contact holes 3d are formed.

Figure 6C:
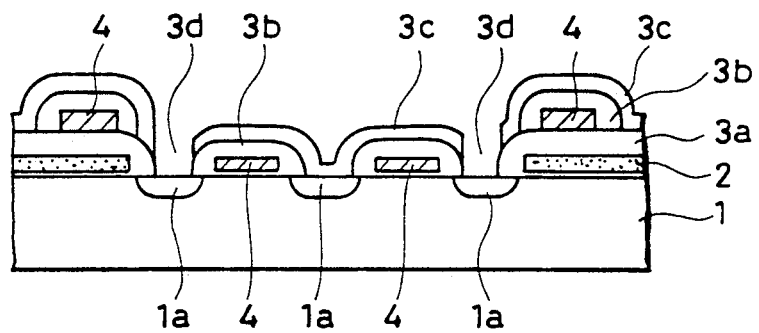

Then, as shown in FIG. 6C, the resist layer 5 is removed. The horizontal sectional shape of the contact holes 3d is substantially tetragonal, corresponding to the holes 5a in the resist layer.

Figure 6D:
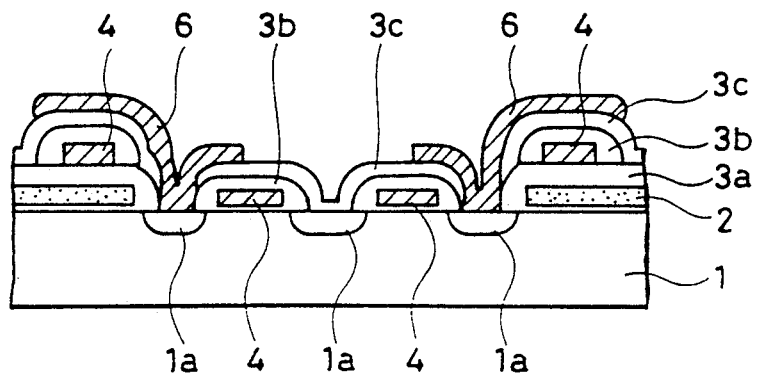
Figure 7:
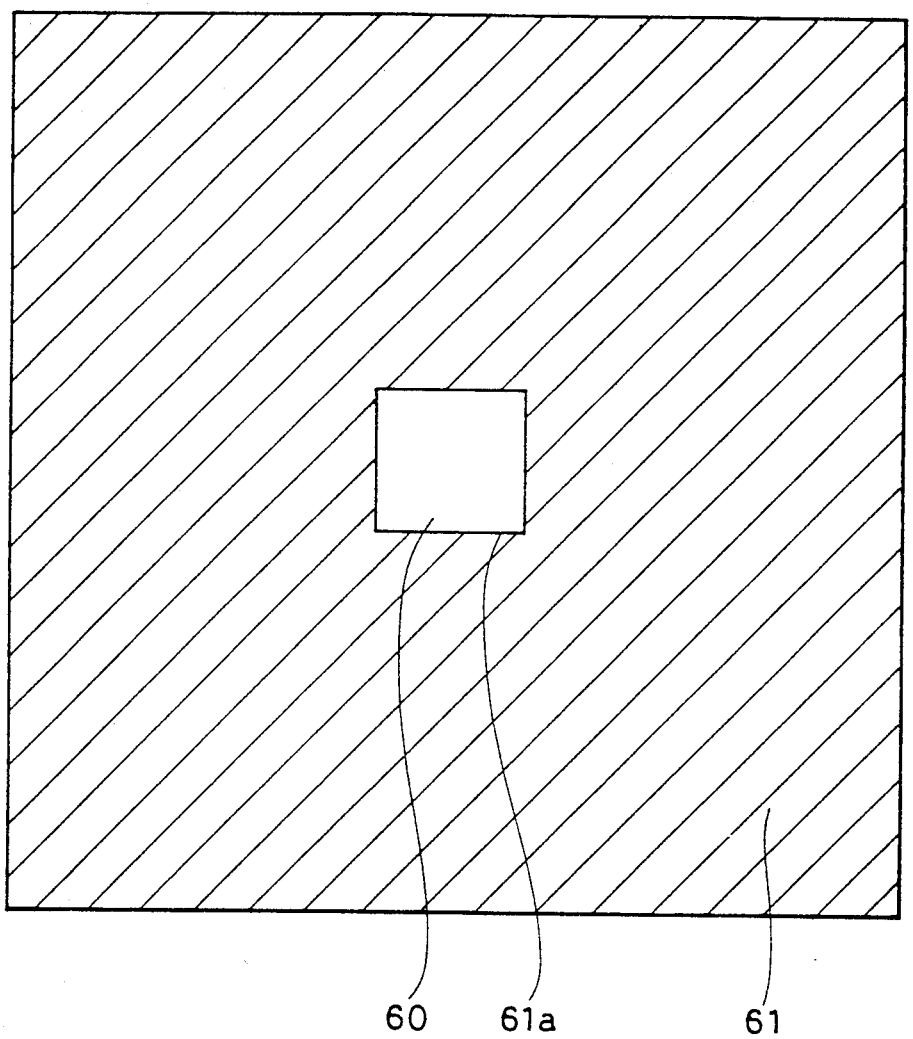
FIG. 7 is a plan view showing a photomask according to the prior art.

Referring to FIG. 6D, storage nodes 6 are formed on the third insulator film 3c. Each of the storage nodes 6 is connected to one of the source/drain regions 1a through the corresponding contact hole 3d.

Thus, when the photomask of this invention is used in the manufacturing process of the memory cell mentioned above, a contact hole having a substantially tetragonal, minute horizontal sectional shape can be formed accurately between the word line 4 and the field shield 2 even if the spacing between the word line 4 and the field shield 2 is small.

Although the above embodiments have been described with reference to the Cr light-shielding layer 11, it will be understood that other opaque layers such as a molybdenum silicide layer can also be used as the light-shielding layer.

Further, although the above embodiments have been explained with reference to a photomask for use in photolithography, this invention is also applicable to a mask for use in X-ray lithography. In that case, the light-shielding layer 11 may be formed of a gold film, and the shifter portions 12 may each be formed of a thin film of diamond.

Moreover, although the photomask in the above embodiments has been described as being used for exposure of a positive type resist layer, it will be understood that the photomask according to this invention can be used also for exposure of a negative type resist layer. In that case, the resist layer is provided with a dot pattern instead of a hole pattern.

As has been described above, when the photomask of this invention is used, the intensity of the light spreading orthogonally to each edge of the tetragonal aperture due to diffraction is reduced by interference with the light the phase of which has been inverted during passage through the shifter portion. On the other hand, the light passed through each corner portion of the tetragonal aperture, without being affected by the shifter portions, contributes to an increase in the intensity of light at the corresponding corner portion of the optical pattern projected on the semiconductor wafer. According to this invention, therefore, it is possible to provide a photomask by which a fine tetragonal optical pattern can be formed on a semiconductor wafer with high contrast.

What is claimed is:

1. A photomask comprising:
a light-transmitting substrate;
a light-shielding layer provided no the substrate;
a substantially tetragonal aperture opened in the light-shielding layer, said aperture having four flat sides forming four intersection regions; and
shifter portions which transmit light and, at the same time, invert the phase of light, said shifter portions being provided to overlap said aperture and said light shielding layer along intermediate portions, but not at said intersection regions, of each side of the substantially tetragonal aperture.

2. The photomask as set forth in claim 1, wherein the light-transmitting substrate is a plate of a material selected from the group consisting of glass and quartz.

3. The photomask as set forth in claim 1, wherein the light-shielding layer is a thin film of a material selected from the group consisting of chromium and metal silicides.

4. The photomask as set forth in claim 1, wherein the shifter portions each comprise a resin layer.

5. The photomask as set forth in claim 1, wherein the light-shielding layer is a thin film of gold, and the shifter portions each comprise a thin film of diamond.

6. A photomask comprising:
a light-transmitting substrate;
a light-shielding layer provided on the substrate;
an aperture opened in the light-shielding layer, said aperture having at least one flat side intersecting with at least one other aperture side to form at least two intersection regions; and
means for shifting the phase of a portion but not all of light passing through the aperture, said means for shifting overlapping said aperture and said light shielding layer along at least one said flat side exclusive of said intersection regions, such that light passing through the aperture produces an exposure pattern having a straight edge corresponding to the flat side of the aperture.

7. The photomask as set forth in claim 6, wherein the light-transmitting substrate is a plate of a material selected from the group consisting of glass and quartz.

8. The photomask as set forth in claim 6, wherein the light-shielding layer is a thin film of a material selected from the group consisting of chromium and metal silicides.

9. The photomask as set forth in claim 6, wherein said means for shifting comprise a resin layer.

10. The photomask as set forth in claim 6, wherein the light-shielding layer is a thin film of gold, and said means for shifting comprises a thin film of diamond.

11. The photomask as set forth in claim 6, wherein said means for shifting inverts the phase of said portion of light passing through the aperture along the flat side.

12. A photomask comprising:
a light-transmitting substrate;
a light-shielding layer provided on the substrate;
an aperture opened in the light-shielding layer, said aperture having at least two flat sides joined at a non-zero angle to form an intersection region; and
means for shifting the phase of a portion but not all of light passing through the aperture, said means for shifting overlapping said aperture and said light shielding layer along each of the two flat sides, exclusive of said intersection region such that light passing through the aperture produces an exposure pattern having a corner corresponding to said corner formed by the two flat sides of the aperture.

13. The photomask as set forth in claim 12, wherein the light-transmitting substrate is a plate of a material selected from the group consisting of glass and quartz.

14. The photomask as set forth in claim 12, wherein the light-shielding layer is a thin film of a material selected from the group consisting of chromium and metal silicides.

15. The photomask as set forth in claim 12, wherein said means for shifting comprise a resin layer.

16. The photomask as set forth in claim 12, wherein the light-shielding layer is a thin film of gold, and said means for shifting comprise a thin film of diamond.

17. The photomask as set forth in claim 12, wherein said means for shifting inverts the phase of said portion of light passing through the aperture along each of the two flat sides.

18. The photomask as set forth in claim 12, wherein said aperture is substantially tetragonal in shape.

19. The photomask as set forth in claim 18, wherein said means for shifting comprise four shifter portions, each on a flat side of said aperture and positioned over said light-shielding layer.

20. A method of irradiating a surface, comprising the steps of:
- (a) passing a first portion of light through an aperture at intersection regions formed with at least one flat side of said aperture without a phase shift of said first portion;
- (b) passing a second portion of light through said aperture and concurrently shifting the phase of said second portion of light wherein said second portion of light passes along said flat side of the aperture exclusive of said intersection regions; and
- (c) applying the shifted and unshifted light together on a surface to be irradiated to produce an irradiation pattern thereon having a straight edge corresponding to the flat side of the aperture.

21. A method as in claim 20, further comprising the steps of:

passing an additional portion of light through said aperture and concurrently shifting the phase of said additional portion of light wherein said additional portion of light passes along a second flat side of the aperture forming a corner with the first flat side; and applying the shifted additional portion of light on the surface to be irradiated such that said irradiation pattern has a corner corresponding to corner formed by the first and second flat sides of the aperture.

* * * * *

UNITED STATES PATENT AND TRADEMARK OFFICE
CERTIFICATE OF CORRECTION

PATENT NO. : 5,248,574
DATED : September 28, 1993
INVENTOR(S) : Kazuya KAMON

It is certified that error appears in the above-indentified patent and that said Letters Patent is hereby corrected as shown below:

Column 5, line 59, change "no" to --on--.

Signed and Sealed this

Sixteenth Day of August, 1994

Attest:

BRUCE LEHMAN

Attesting Officer          Commissioner of Patents and Trademarks